United States Patent [19]

Tonai et al.

[11] Patent Number: 5,345,075
[45] Date of Patent: Sep. 6, 1994

[54] SEMICONDUCTOR PHOTODETECTOR WITH DIELECTRIC SHIELDING

[75] Inventors: Ichiro Tonai; Yoshiki Kuhara, both of Osaka, Japan

[73] Assignee: Sumitomo Electric Industries, Ltd., Osaka, Japan

[21] Appl. No.: 28,123

[22] Filed: Mar. 9, 1993

Related U.S. Application Data

[63] Continuation-in-part of Ser. No. 787,954, Nov. 5, 1991, Pat. No. 5,214,276.

[30] Foreign Application Priority Data

Nov. 13, 1990 [JP] Japan .................................. 2-308094

[51] Int. Cl.$^5$ ................................................. H01J 5/16
[52] U.S. Cl. .................................. 250/227.24; 257/435
[58] Field of Search ............... 250/214.1, 216, 227.24; 257/431, 432, 435

[56] References Cited

U.S. PATENT DOCUMENTS 5,015,844  5/1991  Cole ........................ 250/227.24
5,159,186  10/1992  Ohzu ........................ 257/435

Primary Examiner—David C. Nelms
Attorney, Agent, or Firm—Cushman, Darby & Cushman

[57] ABSTRACT

A semiconductor photodetector comprising a photodiode chip, a header for mounting the chip, a receptacle, and a ferrule for holding an end of an optical fiber. The photodetector does without a lens. A dielectric layer covers a periphery of the photodiode chip for shielding it from incidence of extra light beams by reflecting or absorbing light. Omission of a lens reduces the costs of parts and assembly. Since no light beams enter the peripheral part of photodiode chip, no delayed photocurrent is produced. Reproduced signals are immune from deformation or delay of phase. The photodetector facilitates wide prevalence of optoelectronic communication.

9 Claims, 4 Drawing Sheets

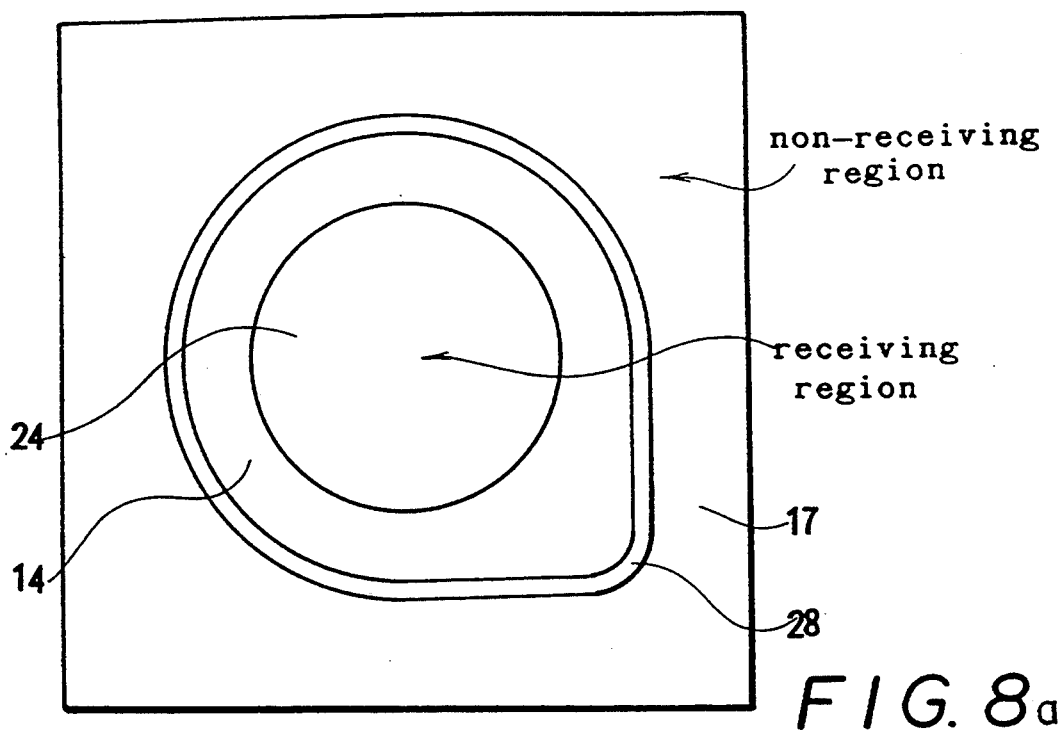
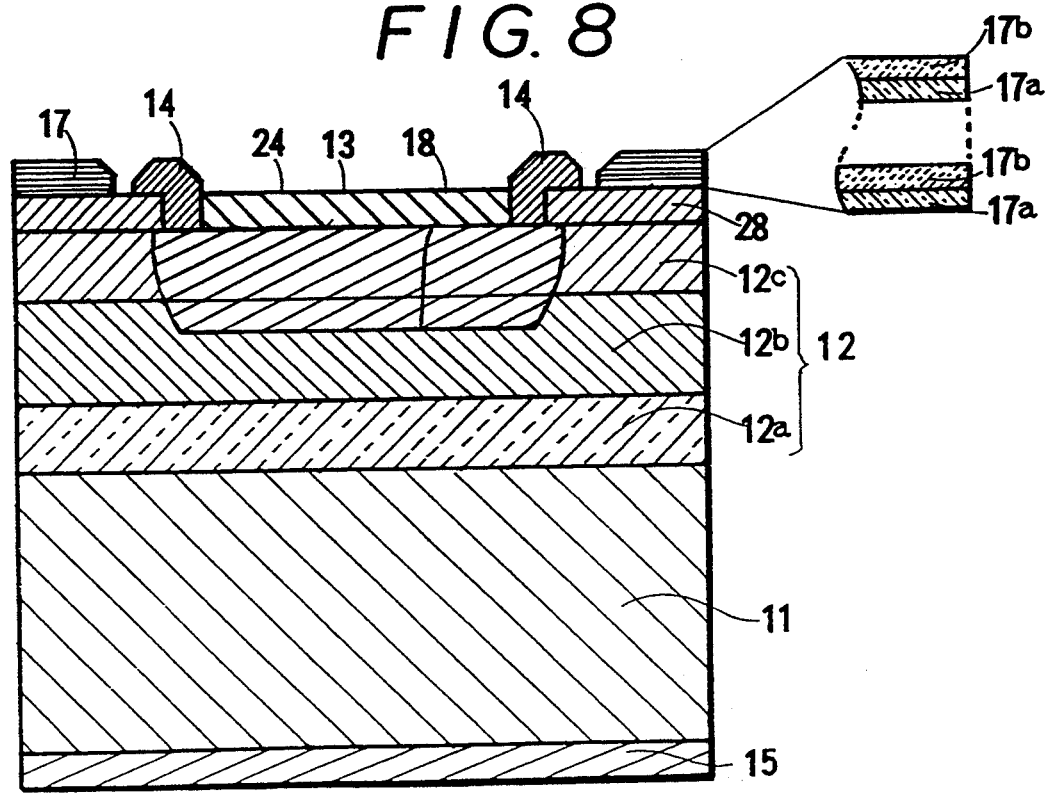

SEMICONDUCTOR PHOTODETECTOR WITH DIELECTRIC SHIELDING

This is a continuation-in-part of application Ser. No. 07/787954, which was filed Nov. 5, 1991 and is now issued as U.S. Pat. No. 5,214,276.

FIELD OF THE INVENTION

This invention relates to a semiconductor photodetector used in a detecting device of optoelectronic communication system.

BACKGROUND OF THE INVENTION

A conventional semiconductor photodetector used in an optoelectronic telecommunication system utilizing optical fibers as a medium of communication. FIG. 3 exhibits an example of a prior photodetector device. The photodetector device has a photodiode chip (1) which converts light beams into photocurrents, a header (2) for holding the photodiode chip (1) thereupon, leads (3) for sending bias voltage or photocurrent to the photodiode chip (1), a cap (4) for covering the photodiode chip (1) with a transparent window (5), a lens (9) for converging light signals, a lens mount (10) for keeping the lens (9) in a coaxial position in front of the photodiode chip (1), a receptacle (8) having a cylindrical portion for sustaining a ferrule (7). The cap (4) and the transparent window (5) airtightly keep the photodiode chip (1) in the closed space enclosed by the header (2), the cap (4) and the transparent window (5). The ferrule (7) fixes an end of an optical fiber (6) for the transmission of light signals. The lens (9) is provided between the end of the optical fiber (6) and the photodiode (1) for converging light beams emitted from the optical fiber on the photodiode chip (1) efficiently. Such a photodetector device shown by FIG. 3 is called a coaxial type.

Conventional photodetector devices aim to a coupling of a photodiode chip with a single-mode fiber or a multi-mode fiber for transmitting light signals. For example, for the light of 1.3 $\mu$m wavelength, a single-mode fiber has a core whose diameter is about 10 $\mu$m and a multi-mode fiber has a core of about 50 $\mu$m in diameter. The light beams emitted from the end of an optical fiber spread in a free space as a cone whose top angle is determined by the difference of refractive indices between a core and a cladding of the fiber. The lens (9) effectively converges the spreading light cone on a receiving region of the photodiode. When a high speed type photodiode with a narrow receiving region less than 100 $\mu$m in diameter is used as a photodiode chip, a non-spherical lens or selfoc lens is preferably adopted as the lens, because the non-spherical lens and the selfoc lens have less aberration than an ordinary spherical lens. The adoption of such lens raises the cost of producing the photodetecting device.

Furthermore, even if such an expensive non-spherical or selfoc lens is used, the adjustment of positions of the fiber end, the lens and the receiving area of the photodiode requires rigorous preciseness. Spot welding by a YAG laser is used twice to weld the header (2) to the lens mount (10) along line A and to weld the lens mount (10) to the receptacle (8) along line B. Owing to twice adjustment processes and twice welding processes, some aberration is likely to occur at welding line B between the receptacle (8) and the lens mount (10) or at welding line A between the lens mount (10) and the header (2), which leads to a low yield of products between 70% and 80%. Moreover, it takes a long time to align three parts, i.e. the receiving region of the photodiode, the center of the lens and the end of the optical fiber, rigorously.

What we must avoid is that the light beams emitted from the end of the fiber irradiate on an exterior part (non-receiving region) of the photodiode. FIG. 4 demonstrates the condition that the light beams irradiate on the non-receiving region. There is actually a lens (9) between the fiber end and the photodiode chip (1) in a conventional one. A straight line simply denotes the lens. The lens will converge light beams (16) emitted from a fiber core (6') on a narrow receiving region of the photodiode chip as shown by dotted lines (16).

What would occur if the lens (9) were omitted? Since the beams would not be converged and would spread in a cone, some outer beams (20) would attain the exterior part (non-receiving region) of the photodiode. The photodiode chip (1) has an n-type or p-type semiconductor substrate (11), and epitaxial layers (12) with the same conduction property epitaxially grown on the substrate (11), a dish-like diffusion region (13) produced by diffusing some dopant at the center of the epitaxial layers (12). The diffusion region (13) has the reciprocal conduction property to the epitaxial layers (12). The boundary (18) between the epitaxial layers (12) and the diffusion region (13) is called a pn-junction (18). Depletion region, where electrons and holes are swept away by the electrical field, is formed at both side of the pn-junction (18). Thickness of the depletion region is some microns. An annular electrode (14) is formed on the diffusion region (13). Another electrode (15) is formed on the bottom surface of the semiconductor substrate (11).

The fiber (6) emits light beams bearing signals in a light cone defined by the difference of refractive indices between the core and the cladding. Most of the light beams are absorbed within the central receiving region on the pn-junction. The beams excite pairs of electrons and holes near the pn-junction. Since a strong electric field stands in the depletion region by the annular electrode (14) and the bottom electrode (15), the electrons and holes are accelerated by the strong electric field. The carriers (electrons and holes) run at high speed toward the epitaxial layers (12) and the diffusion region (13). The flow of the carriers produced by light is called a photocurrent. The photocurrent flows out through the the annular electrode (14) and the bottom electrode (15) and is amplified to some extent. Such beams (16) which enter the receiving region within the annular electrode (14) induce no problem.

However, other parts of beams (20) sometimes enter the non-receiving region outside the pn-junction (18). The extra beams (20) invite a serious problem. The extra beams (20) also excite pairs of electrons and holes. Since the non-receiving region lies outside the depletion region, there is no electric field in the non-receiving region. The electrons and holes produced in the non-receiving region diffuse in all directions. Some of the carriers trek toward the electrodes (14) and (15) at slow velocity. The others are lost by the recombination with majority carriers. Slow trekking carriers make a delayed photocurrent.

The delayed photocurrent will incur a delay of phase and deform analog waves in the case of detection of analog signals. The delayed part of photocurrents will deform pulse waves in the detection of digital signals.

Especially, the delay will induce a long tail on the falling portion of a rectangular pulses as shown in FIG. 5. The duration of the tail is about microseconds. The tail of the reproduced pulse will disturb high speed digital communication. To avoid the occurrence of the delayed photocurrent, expensive converging optics must be used at present in order to converge the light beams from an optical fiber on a narrow receiving region of a photodiode chip without leak beams entering the non-receiving region outside the pn-junction (18). An optoelectronic communication system cannot dispense with semiconductor photodetecting devices. But the present phtodetectlng devices still suffer from the difficulty above-mentioned.

The necessity of a sophisticated converging optics, e.g. non-spherical lens or selfoc lens impedes wide prevalence of the optoelectronic telecommunication system. One purpose of this invention is to provide a semiconductor photodetector which dispenses with sophisticated, expensive converging optics. Another purpose of this invention is to provide a photodetector which can prevent extra, outer beams from entering the non-receiving region. The other purpose of this invention to provide a semiconductor detector which enables us to construct a high speed digital optoelectronic telecommunication system.

SUMMARY OF THE INVENTION

The photodetector of tills invention comprises a photodiode chip having a semiconductor substrate, semiconductor epitaxial layers, a pn-junction, an annular electrode on the pn-junction and another electrode for detecting light signals transmitted in an optical fiber, a header on which the photodiode chip is mounted, a cylindrical receptacle welded to the header, leads piercing the header and being connected to the electrodes of the photodiode chip for sending currents, a ferrule holding an end of the optical fiber for transmitting light signals therein, the ferrule being inserted and fixed in the receptacle, wherein the light beams emitted from the fiber directly reaches the photodiode chip without passing through a lens, and a dielectric layer formed outside of the annular electrode for preventing light beams from reaching the epitaxial layer by reflecting or absorbing the light beams.

Since this invention provides a photodetector having a photodiode with a dielectric layer which reflects or absorbs the extra light beams irradiating the outer, non-receiving region outside the annular electrode, no light beams enter the non-receiving region. No extra beams yield excite pairs of electrons and holes. No delayed photocurrent occurs. Analog signals will be immune from phase delay or deformation. No long tail will accompany a rectangular pulse on a falling side in digital signal communication. Since leak light beams are fully cut by the dielectric layer, converging optics, e.g. selfoc lens or non-spherical lens is unnecessary. Omission of a lens and a lens mount alleviates both parts cost and assembly cost. Time of coaxial adjustment and welding processes is reduced from two times to one time. Thus, A high speed transmission of light signals has been realized by this invention. Inexpensive photodetectors of high quality will accelerate wide prevalence of optoelectronic communication systems.

BRIEF DESCRIPTION OF THE DRAWINGS

FIG. 7 is a plan view of a photodiode with a dielectric layer outside of an annular electrode as an embodiment of this invention.

FIGS. 8 and 8a is a sectional view of a photodiode with a dielectric layer for absorbing or reflecting light beams as an embodiment of this invention.

DETAILED DESCRIPTION OF PREFERRED EMBODIMENTS

Figure 1:
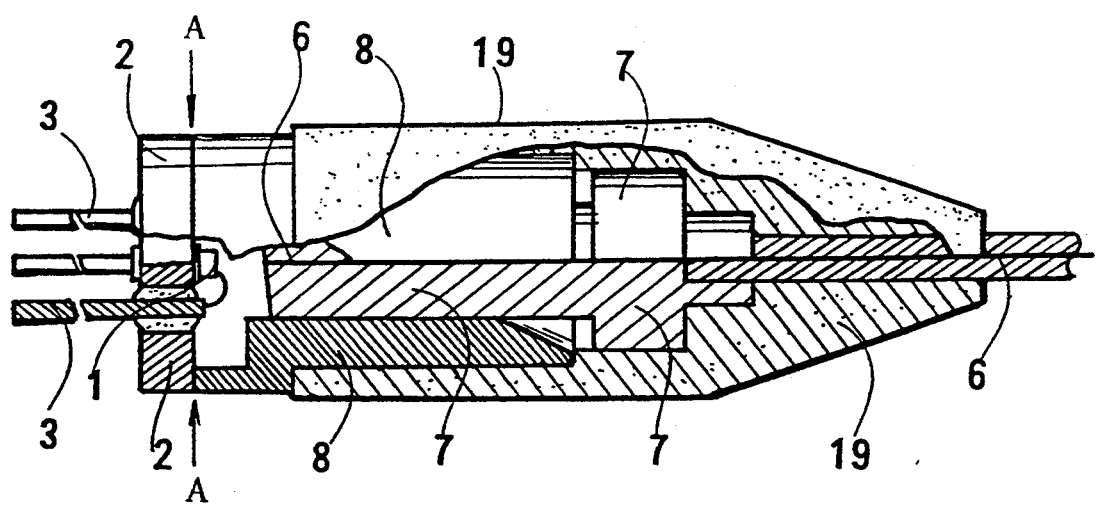
FIG. 1 is a partially-sectioned view of an embodiment of a semiconductor photodetector of this invention.

An embodiment exhibited by FIG. 1 and FIG. 2 will be explained. What differs from prior art shown in FIG. 3 is that a photodiode chip has a dielectric multilayer on an exterior side around a pn-junction for reflecting or absorbing light and a converging optics, e.g. a lens for converging light beams on a receiving region of the photodiode chip is omitted.

A photodiode chip (1) is mounted on a header (2) which is a metal disc with some bores. The photodiode has a receiving region at its center and a non-receiving region on a periphery of the upper surface. Leads (3) pierce the bores of the header (2) and are fixed at the bores by insulator, e.g. glass. The leads (3) are connected to electrodes of the photodiode chip (1) by wires for taking out photocurrents from the photodiode chip (1). This detector lacks a lens (9) and a lens mount (10) of FIG. 3. A cylindrical receptacle (8) with an opening is directly welded to the header (2) on the surface having the photodiode chip (1). Relative position of the receptacle (8) on the header (2) is adjusted so that an extension of the fiber can meet with the center of receiving region of the photodiode. Simple structure spares one adjustment work between a lens (9) and a fiber (6). A YAG laser is often used to weld the receptacle (8) to the header (2) in spots around welding line A shown in FIG. 1.

A ferrule (7) has a narrow axial hole. An end of an optical fiber (6) is fixed by the ferrule (7) in the hole. The ferrule (7) is inserted into the opening of the receptacle (8). The photodiode chip (1) directly faces the end of the fiber (6). The distance between the fiber end and the photodiode chip (1) is adjusted so as to obtain a maximum coupling efficiency. The ferrule (7) is permanently fixed to the receptacle (8) by gluing or welding. They can be glued together by applying resin adhesive on sides of the ferrule (7). Otherwise, they can be welded by shooting, e.g. three points on the side of the receptacle (8) holding the ferrule (7) with three YAG laser beams.

After the ferrule has been fixed into the receptacle (8), a conical, elastic protector (19) is fitted on the exterior sides of the ferrule (7) and the receptacle (8). The protector is made from e.g. rubber. The elastic protector (19) protects the optical fiber by preventing the fiber from being bent in excessively small curvature in the vicinity of the ferrule end.

This photodetector can do without a lens for converging light beams on the receiving region of the photodiode. This is because the photodiode is provided with a dielectric layer which prevents leak beams from entering the peripheral non-receiving region. As demonstrated in FIG. 2, light beams spread in a cone from the end of the fiber (6). The top angle of the light cone is determined by the difference of refractive indices between the core and cladding of the fiber. Most of the beams(16) irradiate the central receiving region within the annular electrode (14). The other extra beams (20) irradiate the outer non-receiving region. But the outer, non-receiving region is covered with a dielectric multilayer (17). The extra beams are reflected or absorbed by the dielectric multilayer. No beams enter the non-receiving region. No photocurrent is produced in the non-receiving region outside the pn-junction. If the dielectric multilayer (17) shields the non-receiving region from light by reflecting light, the product of the thickness by the refractive index, i.e. effective thickness of each layer must be one fourth of the wavelength of light. If the dielectric layer shields the non-receiving region from light by absorbing light, the dielectric layer must have high absorption for the light.

Figure 2:
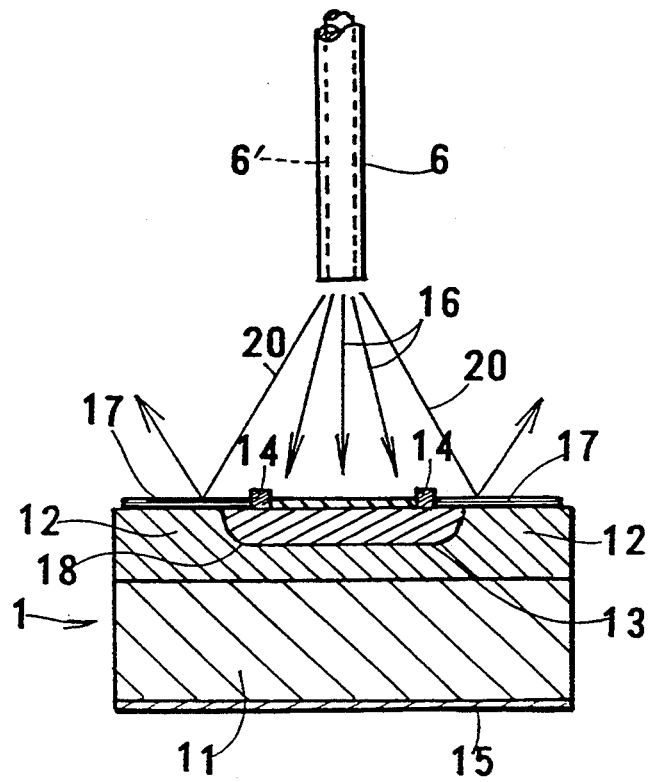
FIG. 2 is an enlarged view of a part of FIG. 1; view of a new photodiode chip, an end of an optical fiber and light beams emitted from the fiber end.
Figure 3:
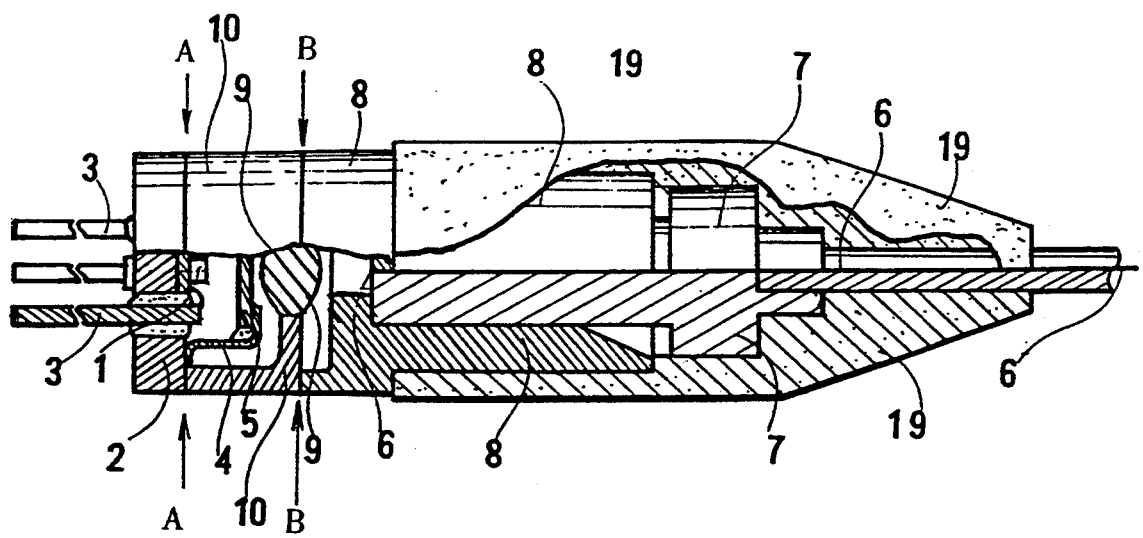
FIG. 3 is a partially-sectioned view of a conventional semiconductor photodetector with a lens for converging light beams from a fiber.
Figure 4:
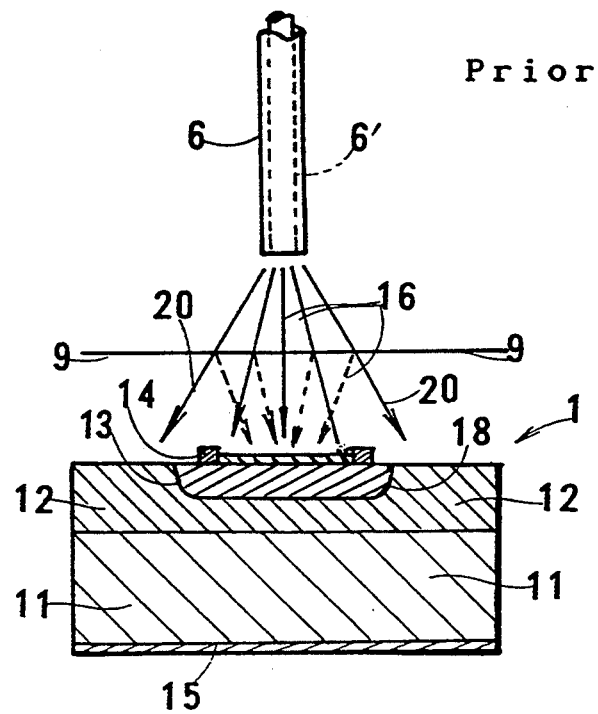
FIG. 4 is an enlarged view of a part of FIG. 3; view of a prior photodiode chip, an end of an optical fiber and light beams emitted from the fiber end.
Figure 6:
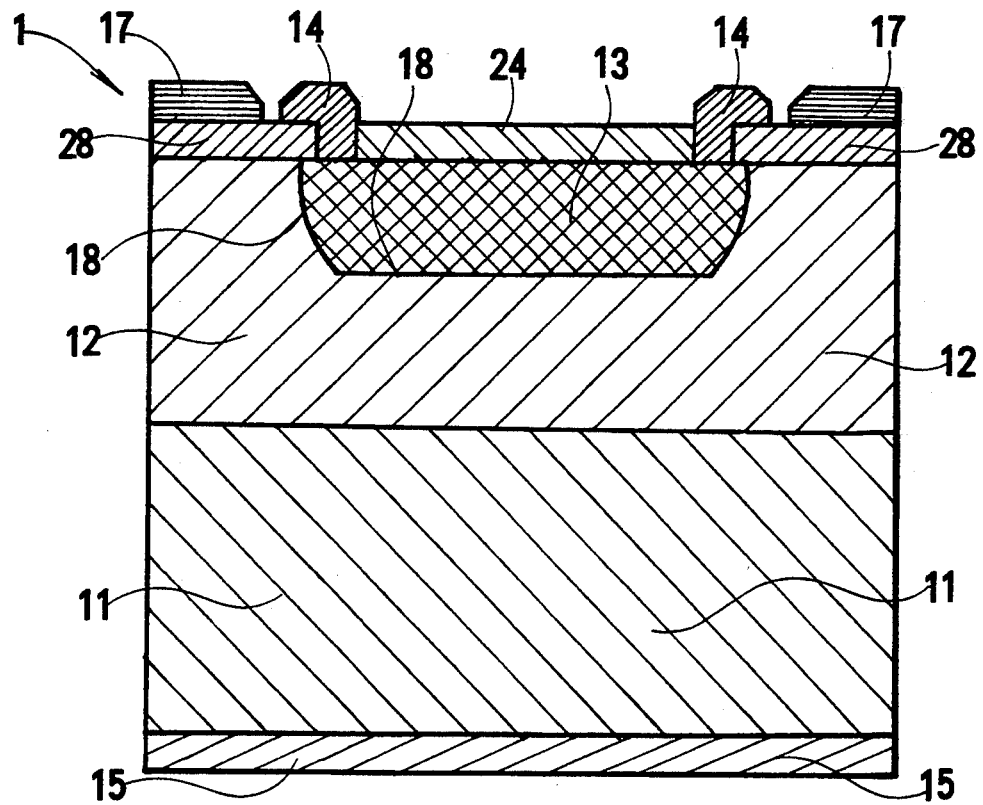
FIG. 6 is a sectional view of a photodiode with a dielectric layer around an annular electrode according to this invention.

FIG. 6 shows an enlarged view of the photodiode of FIG. 2. This is a pin photodiode. A semiconductor substrate (11) is either n-type or p-type. A dish-like region (13) has reciprocal conduction property. Namely, If the substrate is n-type, the dish-like region (13) is p-type. If the substrate (11) is p-type, the dish-like region is n-type. For example, the substrate is assumed to be n-type for avoiding mentioning alternatives. An undoped semiconductor layer (12) is deposited on the n-type substrate (11). The undoped layer (12) can be constituted by plural layers. The dish-like region (13) of p-type is formed at the center of the undoped layer (12) by ion implantation or diffusion of p-type dopant. The boundary between the undoped layer (12) and the dish-like region (13) is a pn-junction (18). An n-side electrode (15) is formed on the bottom surface of the n-type substrate. An annular p-side electrode (14) is formed on the periphery of the dish-like region (13) which is photosensitive.

A part enclosed by the annular electrode (14) is called a light receiving region. An antireflection film (24) is deposited on the central region enclosed by the annular electrode (14). A passivation film (28) is formed on the undopeal layer (12) outside the annular electrode (14). A dielectric multilayer (17) is deposited on the passivation film (28) for reflecting or absorbing light beams attaining thereto. The dielectric multilayer (17) is important, because it reflects or absorbs the light beams which attain the peripheral portion of the photodiode.

Figure 5:
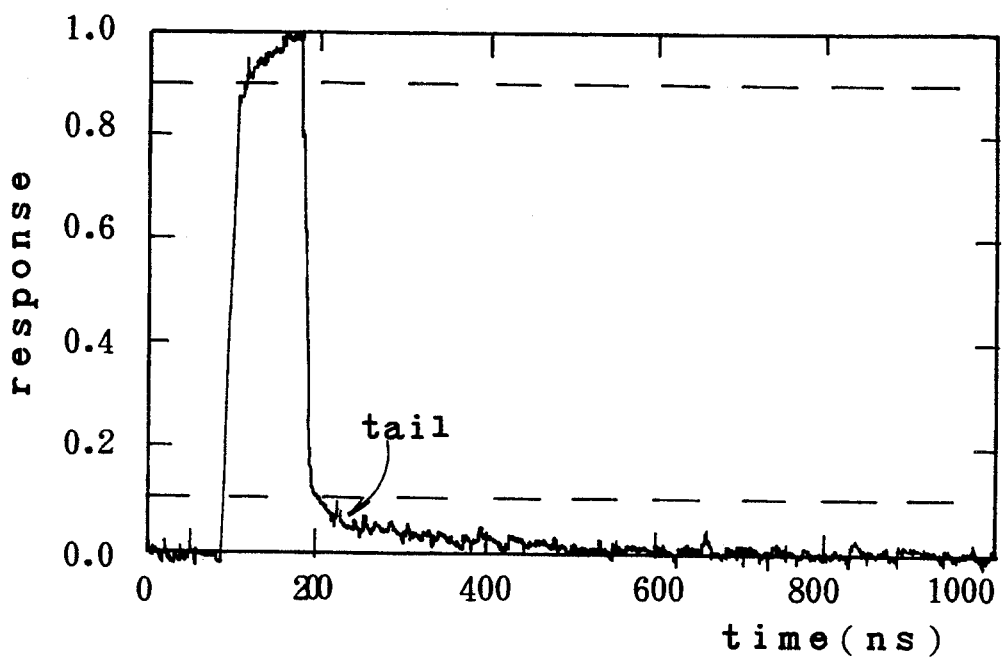
FIG. 5 is a graph showing a received pulse wave with a long tail on the falling side.

If a part of light beams deviate from the receiving region enclosed by the annular electrode (14) and attain the peripheral portion, the beams are reflected or absorbed at the dielectric multilayer (17). No beams enter the non-receiving region beyond the pn-junction. No extra pairs of carriers are yielded in the region. No slow photocurrent flows. Pulse signals are immune from a tall shown in FIG. 5.

FIG. 7 and FIGS. 8 and 8a show another example of a photodiode (1). On an n+-type substrate (11), an undoped InP buffer layer (12a) of a 2 $\mu$m thickness, and an undoped InGaAs receiving layer (12b) of a 3.5 $\mu$m thickness are epitaxially grown in turn. A p-type region is selectively formed at a central part of the epitaxial layers by diffusing zinc (Zn) to the masked InP wafer by the closed tube method. The diameter of the p-type region is 100 $\mu$m. An antireflection film (24) is a SiN film of a 0.18 $\mu$m thickness. A dielectric multilayer (17) consists of repetitions of an amorphous silicon (a-Si) sublayer (17a) of a 120 nm thickness with a refractive index of 3.2 and a silicon nitride (SIN) sublayer (17b) of a 215 nm thickness with a refractive index of 1.8. The products of the thickness by the refractive index (i.e. effective thickness) is one fourth of wavelength ($\lambda$/4) of the light.

An example of a photodetector used for transmitting long wavelength signals of 1.1 $\mu$m to 1.6 $\mu$m will be now explained. A photodiode chip (1) has an n-type InP substrate(11), an undoped, epitaxial InGaAs layer(12), a dish-like p-type region (13) produced by diffusing zinc (Zn), an annular p-side electrode (14) formed on the p-type region, an n-side electrode (15) formed on a bottom of the InP substrate (11), an antireflection layer (24) covering the central light-receiving region within the annular electrode (14), a passlvatlon layer (28) and a dielectric multilayer (17) formed on the periphery of the chip (1). The dish-like p-region is 100 $\mu$m in diameter.

The photodiode chip (1) is bonded on a covar header (2) by SnPb solder. The annular electrode (14) is coupled to the lead (3) by a gold wire of 20 $\mu$m$\phi$ in diameter. A ferrule (7) maintains an end of an optical fiber (6). The front end of the ferrule (7) is polished slantingly in order to prevent the light beams reflected at the end from returning to a light source. The inclination angle of the end surface to a surface perpendicular to the axial line is 8 degrees. The ferrule (7) is inserted into an axial hole of a receptacle (8) and welded thereto by YAG laser welding or bonded by resin adhesive.

The position of the ferrule (7) in the receptacle (8) shall be determined to keep a certain distance from the photodiode chip (1) which is calculated by geometric optics in order to converge light beams on the narrow receiving area of the photodiode chip with high efficiency.

Laser beams, e.g. of 1.3 $\mu$m in wavelength are introduced into the other end of the optical fiber (6). The beams pass through the optical fiber and go out of the near end of the fiber (6). The laser beams irradiate the receiving region of the photodiode chip (1) and produce photocurrent. An optimum position of the receptacle (8) on the header (2) is welded at line A by YAG laser welding at the optimum position. Then a rubber protector (9) covers a rear part of the fiber in order to protect the fiber from being bent excessively.

The prior module shown in FIG. 3 requires two adjustment works at line A and line B. At line A the lens mount (10) must be welded to the header (2). At line B, the receptacle (8) is welded to the lens mount (10). Double horizontal adjustment works which take a long time itself must precede the welding work. However, this invention dispenses with the lens. The adjustment of the horizontal position of the lens becomes unnecessary. This invention can eliminate one adjustment process and one welding process as unnecessary processes. Omission of the processes reduces the time and cost spending on assembly to a great extent.

It is undesirable that the lack of a lens would incur a decrease of sensitivity of a photodetector module. But 95% of samples reveal high sensitivity of 0.8 A/W. Here, the sensitivity is defined as the ratio of photocurrent (A) produced in the photodiode to light beam power (W) entering the photodiode. The omission of a lens invites no decline of sensitivity.

Another criterion of a photodiode is a high speed response which is an ability to reproduce electric signals from optical signals without delay and deformation. Digital performance of the photodetector was examined by applying the photodetector as a receiver on digital optoelectronic communication with a speed of 125 Mbps. No deformation of the signals, e.g. a long tail of rectangular pulses, nor jitter which is a phenomenon that rising part or galling part of a pulse fluctuates at random has not been observed. Thus this photodetector is suitable for high speed digital optoelectronic communication. This is because incidence of leak beams is fully excluded from the peripheral non-receiving region and no delayed photocurrent is produced in the non-receiving region of the photodiode.

Otherwise, the analog performance of the photodetector was also examined by applying the photodetector for detecting analog image data signals of 40 channels. The photodetector enjoys high sensitivity of 0.8 A/W as aforementioned. Therefore, from the standpoint of sensitivity, the photodetector can be used for detecting high speed analog signals of 40 channels. What is important is the quality of reproduced picture. Prior photodetectors cannot suppress flickering of pictures on a display due to the phase delay of received analog signals. The phase delay is caused by leak light entering the non-receiving region of a prior photodiode despite expensive converging optics.

But this invention succeeds in suppressing the flickering of pictures on a display, because no leak light enters the peripheral region of the photodiode. The photodetector of this invention enjoys high performance as a receiver both of analog data transmission and digital data transmission.

Omission of converging optics alleviates both cost of assembly and the cost of parts. Expensive photodetectors have so far impeded wide prevalence of optoelectronic communication. But inexpensive photodetectors of high quality of this invention will accelerate wide, practical pervasion of optoelectronic communication systems.

What we claim is:

1. A semiconductor photodetector comprising:
   a photodiode chip having a substrate, epitaxial semiconductor layers grown on the substrate, a pn-junction formed in a central part of the epitaxial semiconductor layers, an annular electrode formed on the pn-junction and another electrode formed on the substrate for detecting light signals transmitted in an optical fiber,
   a header on which the photodiode chip is mounted,
   a cylindrical receptacle welded to the header,
   leads piercing the header and being connected to the electrodes of the photodiode chip for sending currents, and
   a ferrule holding an end of an optical fiber for transmitting light signals, the ferrule being inserted and fixed in the receptacle,
   wherein light beams emitted from the optical fiber directly reach the photodiode chip without passing through a lens and a dielectric layer is formed outside the annular electrode on the photodiode chip for preventing light beams from reaching the epitaxial semiconductor layers by reflecting or absorbing the light beams.

2. A semiconductor photodetector as claimed in claim 1, wherein the end of the optical fiber is obliquely cut for forbidding the light reflected at the end going back in the optical fiber.

3. A semiconductor photodetector as claimed in claim 1, wherein a front end of the ferrule is obliquely polished together with the end of the optical fiber for forbidding the light reflected at the end going back in the optical fiber.

4. A semiconductor photodetector as claimed in claim 1, wherein the dielectric layer of the photodiode chip is a dielectric multilayer including alternately deposited first sublayers and second sublayers with different thickness and different refractive indices having an effective thickness equal to one fourth of wavelength of the light.

5. A semiconductor photodetector as claimed in claim 1, wherein the dielectric layer of the photodiode chip is an opaque medium with high absorption factor.

6. A semiconductor photodetector comprising:
   a photodiode chip having an $n^+$-type InP substrate, an undoped InP buffer layer deposited on the $n^+$-type InP substrate, an undoped InGaAs receiving layer deposited on the undoped InP buffer layer, an undoped InP window layer, a p-type region selectively formed on a central part of the undoped InP window layer and upper part of the InGaAs receiving layer, the p-type region being a photosensitive area, an electrode formed on the p-type region, another electrode formed on the InP substrate, an antireflection film deposited on the p-type region which is the photosensitive area, a passivation film deposited on the undoped InP window layer, and a dielectric layer formed on the passivation film for preventing light beams from reaching the undoped InGaAs receiving layer by reflecting or absorbing the light beams,
   a header on which the photodiode chip is mounted,
   a cylindrical receptacle welded to the header,
   leads piercing the header and being connected to the electrodes of the photodiode chip for sending current, and
   a ferrule holding an end of an optical fiber for transmitting light signals, the ferrule being inserted and fixed in the receptacle,
   wherein light beams emitted from the optical fiber directly reach the photodiode chip without passing through a lens and a dielectric layer is formed outside the photosensitive area on the photodiode chip for preventing light beams from reaching the undoped InGaAs receiving layer by reflecting or absorbing the light beams.

7. A semiconductor photodetector as claimed in claim 6, wherein a front end of the ferrule is obliquely polished together with the end of the optical fiber for forbidding the light reflected at the end going back in the optical fiber.

8. A semiconductor photodetector as claimed in claim 6, wherein the dielectric layer of the photodiode chip is a dielectric multilayer including alternately deposited first sublayers and second sublayers with different thicknesses and different refractive indices having an effective thickness equal to one fourth of wavelength of light.

9. A semiconductor photodetector as claimed in claim 8, wherein the dielectric multilayer has altenatingly deposited a-Si sublayers of approximately a 120 nm thickness with a refractive index of approximately 3.2 and SiN sublayers of approximately a 215 nm thickness with a refractive index of approximately 1.8.

* * * * *